(12) United States Patent
Boskamp et al.

(10) Patent No.: US 6,487,436 B1
(45) Date of Patent: Nov. 26, 2002

(54) SWITCHABLE FIELD OF VIEW APPARATUS AND METHOD FOR MAGNETIC RESONANCE IMAGING

(75) Inventors: Ed B. Boskamp, Menomonee Falls, WI (US); Daniel J. Weyers, Wauwatosa, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 16 days.

(21) Appl. No.: 09/681,494

(22) Filed: Apr. 17, 2001

(51) Int. Cl.[7] ............................. A61B 5/055; G01V 3/00
(52) U.S. Cl. ..................... 600/422; 600/415; 324/313; 324/318
(58) Field of Search ................................. 600/410, 415, 600/421, 422, 423; 324/318, 319, 320, 310, 313

(56) References Cited

U.S. PATENT DOCUMENTS

| | | | |
|---|---|---|---|
| 4,881,034 A | * 11/1989 | Kaufman et al. | 324/318 |
| 5,136,273 A | * 8/1992 | Ohta | 324/319 |
| 5,646,531 A | 7/1997 | Renz | |
| 5,647,362 A | * 7/1997 | Fuderer et al. | 324/309 |
| 5,760,583 A | 6/1998 | Sato et al. | |
| 5,917,324 A | 6/1999 | Leussler | |
| 5,928,148 A | * 7/1999 | Wang et al. | 600/420 |
| 5,986,454 A | 11/1999 | Leifer | |
| 5,998,999 A | 12/1999 | Richard et al. | |
| 6,054,854 A | 4/2000 | Kawamoto | |
| 6,060,883 A | 5/2000 | Knüttel | |
| 6,137,291 A | 10/2000 | Szumowski et al. | |
| 6,147,493 A | 11/2000 | Miyoshi | |
| 6,150,816 A | * 11/2000 | Srinivasan | 324/318 |
| 6,175,237 B1 | 1/2001 | Doty et al. | |
| 6,223,065 B1 | * 4/2001 | Misic et al. | 600/410 |

* cited by examiner

*Primary Examiner*—Philip H. Leung
(74) *Attorney, Agent, or Firm*—Timothy J. Ziolkowski; Michael A. Della Penna; Carl B. Horton

(57) ABSTRACT

An MRI apparatus and method for reducing wrap around artifacts during image reconstruction is provided. An RF coil and control configuration includes a center coil and at least one pair of end RF coils configured to encode and excite spins over an adjustable field-of-view (FOV). The adjustable FOV has at least two size designations in response to an FOV size request input. The control connected to the RF coil assembly is capable of switching between the FOV size designations by switching power to activate a center coil alone or the center coil in conjunction with the end coils in unison.

27 Claims, 4 Drawing Sheets

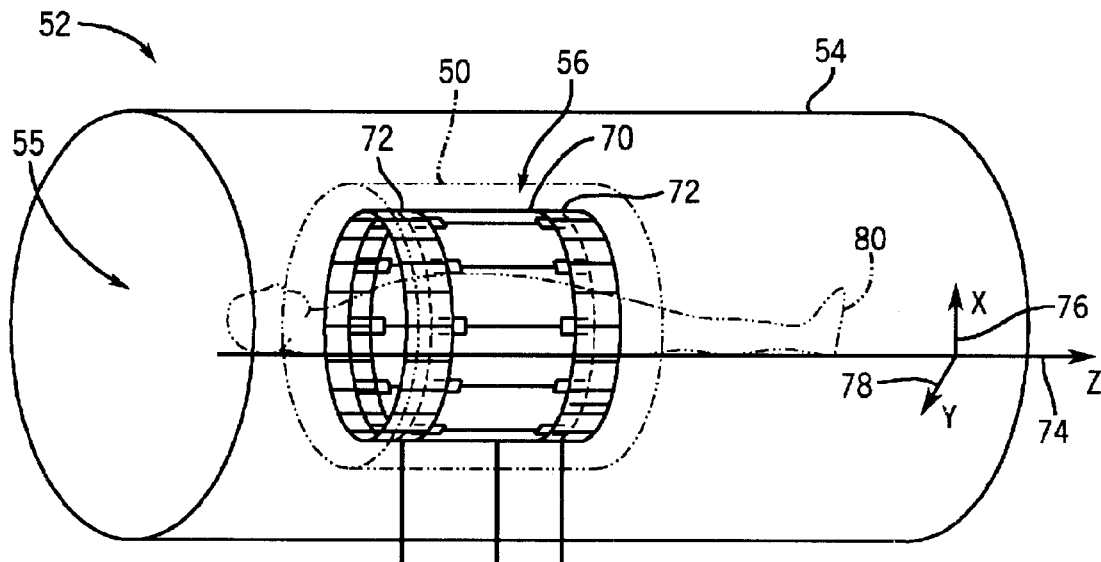
FIG. 2
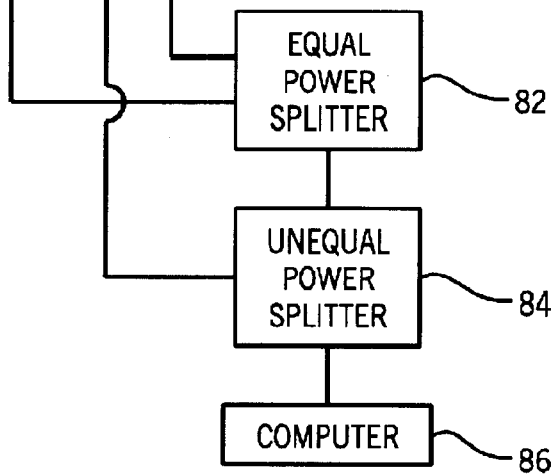

SWITCHABLE FIELD OF VIEW APPARATUS AND METHOD FOR MAGNETIC RESONANCE IMAGING

BACKGROUND OF INVENTION

The present invention relates generally to magnetic resonance imaging (MRI), and more particularly, to a switchable field-of-view (FOV) apparatus and method to reduce the occurrences of wrap around artifacts during image reconstruction.

When a substance such as human tissue is subjected to a uniform magnetic field (polarizing field $B_0$), the individual magnetic moments of the spins in the tissue attempt to align with this polarizing field along a Z-axis, but precess about it in random order at their characteristic Larmor frequency. If the substance, or tissue, is subjected to a magnetic field (excitation field $B_1$) which is in an x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x G_y$ and $G_z$) are employed using gradient coils. Typically, the region to be imaged is scanned by a sequence of measurement cycles in which these gradients vary according to the particular localization method being used. The resulting set of received MRI signals are digitized and processed to reconstruct the image using one of many well-known reconstruction techniques.

The transmission of a radio frequency (RF) excitation pulse through a subject and the reception of the resulting resonant signal is known in the art of nuclear magnetic resonance imaging. Examples of structures capable of transmitting and receiving RF pulses include a helical coil, saddle coil, resonant cavity, and a birdcage resonator or coil. While the use of these structures for transmission and reception of image signals has greatly improved reconstruction of an image, there are some existing drawbacks to the current designs. For example, the occurrence of wrap around artifacts can create distortion during the image reconstruction process. Due to the non-linearity of the gradient coils and the in-homogeneity of the uniform background magnetic field $B_0$, there are areas outside the FOV that resonate at the same frequency as portions inside the FOV, such that aliasing wrap around artifacts are displayed upon image reconstruction. These undesirable wrap around artifacts cause a portion of the imaged subject, which is located outside the FOV, to appear inside of the FOV as part of the volume imaged.

The birdcage resonator and other structures cause limitations as to the strengths of magnetic fields introduced in the system because of their whole-body imaging methodology. Whole-body coils cause more irradiation of patient volume than equivalent shorter length coils. Irradiation levels are regulated according to an average specific power absorption rate (SAR) per unit mass for patients under examination. As a result, there is a need for an apparatus capable of operating with increased magnetic field strength without exceeding regulated absorption rates that also reduces the occurrence of wrap around artifacts during image reconstruction.

It would therefore be desirable to have an RF coil and control apparatus to restrict sensitivity in areas outside a selected FOV, thereby reducing the occurrence of wrap-around artifacts caused by extended areas of a whole-body coil while maintaining good sensitivity and homogeneity within the FOV.

SUMMARY OF INVENTION

The present invention provides a switchable FOV magnetic resonance imaging apparatus and method solving the aforementioned drawbacks.

The invention includes the use of a magnet to produce a magnetic field for MRI imaging of a subject. After the subject is placed within a bore of the magnet having a uniform linear magnetic field so that nuclei within the subject are excited and encoded using a set of magnetic field gradient coils, a desired FOV size is selected by an operator. This selection causes an automatic determination and activation of a center coil only or the center coil and a pair of end coils in combination for transmission of a signal desired to perform imaging of a subject. During activation of the center coil only, the effective longitudinal length of the RF coil is less causing a reduction in wrap around artifacts as compared to a standard whole-body coil. A shorter RF coil causes limited excitation of nuclei in areas outside the desired FOV.

In accordance with one aspect of the invention, an RF coil and control configuration includes an RF coil assembly having a center coil and a pair of end coils. Each end coil is comprised of at least one RF coil, but can include more. The RF coil assembly is configured to encode and excite spins over an adjustable FOV. With activation of both the center coil and the pair of end coils, an imaging scan can be acquired that is comparable to a whole-body coil imaging scan. A control is connected to the RF coil assembly to switch the RF coil assembly between at least two general FOV sizes based on an FOV size input from an operator. The at least two general FOV size designations are determined by the control switching power to activate either a center coil alone or the center coil and the pair of end coils in unison.

In accordance with another aspect of the invention an MRI apparatus to acquire images is disclosed having an MRI system having a plurality of gradient coils positioned about a bore of a magnet to impress a polarizing magnetic field $B_0$ through a subject under examination. An RF transceiver system and an RF switch controlled by a pulse module are included to transmit RF signals to an RF resonator assembly having a center resonator enclosed by a set of end resonators to acquire magnetic resonance (MR) images of the subject. A computer is further included and programmed to receive an FOV input and based on that input, cause transmission of a signal from either the center resonator only or the center resonator and the end resonators simultaneously.

In accordance with yet another aspect of the present invention, a technique of controlling an MRI device having a central RF coil assembly comprised of a central RF coil and at least one pair of end RF coils includes the steps of creating a predetermined parameter based on a length of the central RF coil and then comparing a desired FOV to the predetermined parameter. If the desired FOV is not greater than the predetermined parameter, then the central RF coil is selected for energization so as to perform an image scan of the desired FOV. If the FOV is greater than the selected parameter, then the central RF coil and the at least one pair of end RF coils are selected for energization thereby performing an imaging scan of the desired FOV.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings:

FIG. 2 is a schematic of an RF coil assembly connected to a block diagram of a control system in accordance with the present invention.

DETAILED DESCRIPTION

Figure 1:
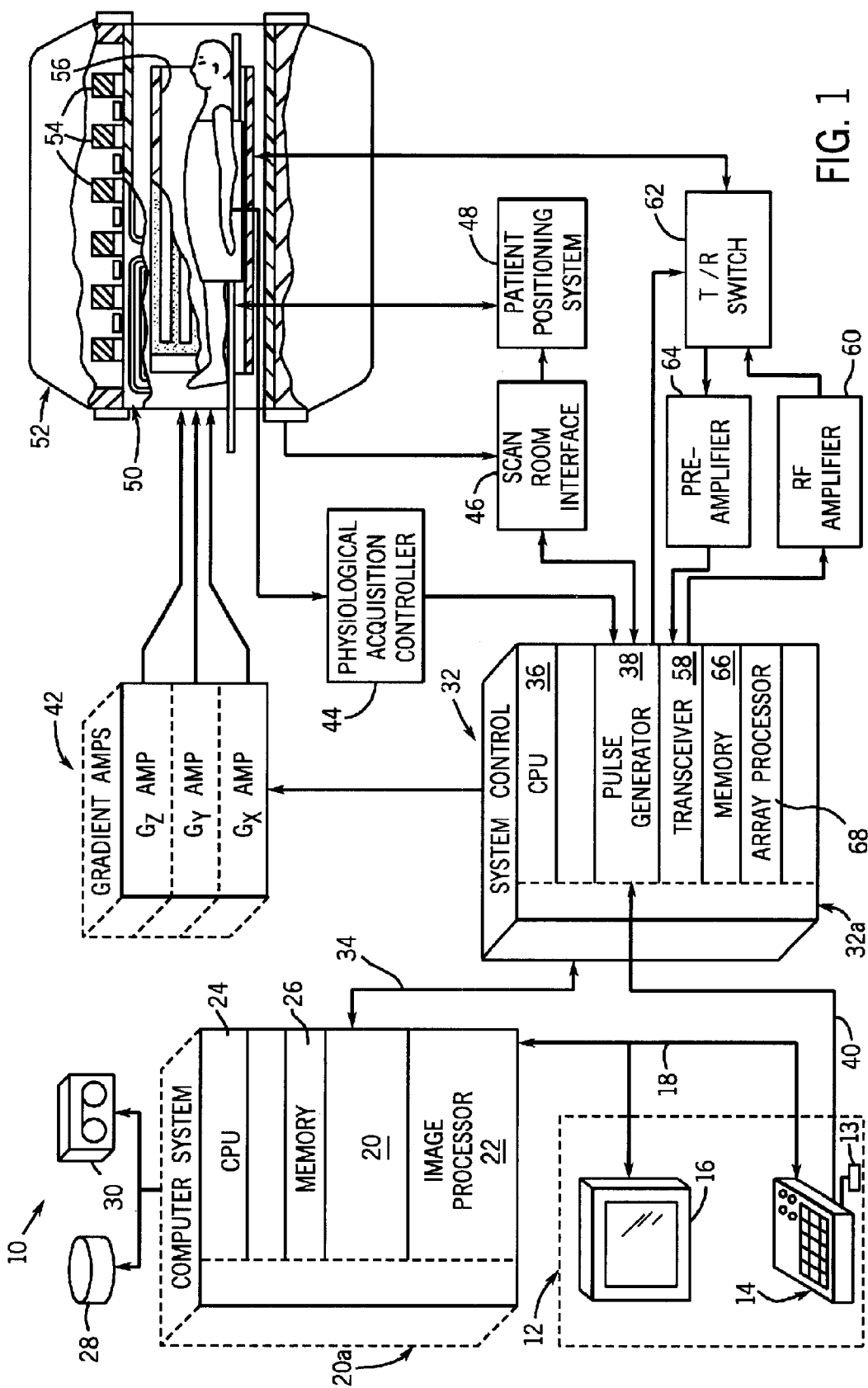
FIG. 1 is a block diagram of a system in accordance with the present invention.

The embodiments of the present invention will now be described in more detail with reference to the accompanying drawings. Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 includes an RF shield to form part of a magnet assembly 52 which includes a polarizing magnet 54 and an RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or a portion thereof and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

FIG. 2 shows one embodiment of the magnet assembly 52 of FIG. 1 in accordance with the present invention. The configuration of the magnetic assembly 52 includes a uniform cylindrical polarizing magnet 54 for generating the static magnetic field $B_0$ in its internal space 55. Disposed within the polarizing magnet 54 is a gradient coil assembly 50 comprised of one or more gradient coils, an RF coil assembly 56, and an RF shield (not shown) that is used to shield the RF energy from penetrating or coupling to the gradients or magnet. The RF coil assembly 56 has a generally cylindrical center coil 70 and at least one pair of end coils 72. Each end coil 72 has one or more RF coils generally aligned along a common longitudinal axis. The pair of end coils 72 partially overlap the center coil 70 so as to minimize any mutual inductance between the center coil 70 and the end coils 72. Preferably, the end coils 72 overlap the center coil 70 by approximately 1 centimeter (cm) and are longitudinally shorter than the center coil 70 having a longitudinal length along a Z-axis 74 of approximately 12 cm. The diameters of the center coil 70 and end coils 72 as measured in the X-Y plane are substantially identical. The center coil 70, in a preferred embodiment, has a longitudinal length of 42 centimeters. Longitudinal lengths less than a standard whole-body coil length of 64 cm are also contemplated and within the scope of the invention.

The center and end coils 70, 72 are configured to encode and excite nuclear spins situated within the uniform magnetic field B in an adjustable FOV or FOV size designation based on an FOV size input. The polarizing magnet 54, gradient coils and RF shield 52, center coil 70, and the pair of end coils 72 are aligned along a common longitudinal center Z-axis 74 that is parallel to the static magnetic field $B_0$. X-axis 76 and Y-axis 78 define vertical and horizontal axes, respectively, for defining spatial positions of nuclei within the RF coil assembly 56 during the encoding process. A patient 80, shown in phantom, is positioned within the RF coil assembly 56 such that the volume to be imaged within the field-of-view (FOV) is centered at the origin of the axes 74–78.

To control the RF coil assembly 56, in one embodiment, an equal power splitter 82 is connected to the pair of end coils 72 so as to provide equal power and alternating electrical current to drive both end coils 72. An unequal power splitter 84 is connected to the center coil 70, generally having a length less than a standard whole-body RF coil, and the equal power splitter 82 to supply power and drive the center coil 70 in unison with the end coils 72 during larger FOV imaging scans. The unequal power splitter 84 is also connected to a computer 86 that includes operator console 12, computer system 20, disk storage 28, tape 30, control 32, physiological acquisition controller 44, scan room interface 46, patient positioning system 48, transmit/receive switch 62, and amplifiers 60, 64, as shown in FIG. 1. The computer 86 is designed to generate control signals, for larger FOV size designations, that cause control 32 to switch power to the center coil 70 and the pair of end coils 72 in unison thereby generating a uniform amplitude magnetic field in the RF coil assembly 56. The computer 86 also causes outputs from the center coil 70 and/or the end coils 72 when the received FOV input is selected. The output from the center coil 70 and the end coils 72 activated together is equal.

Figure 3:
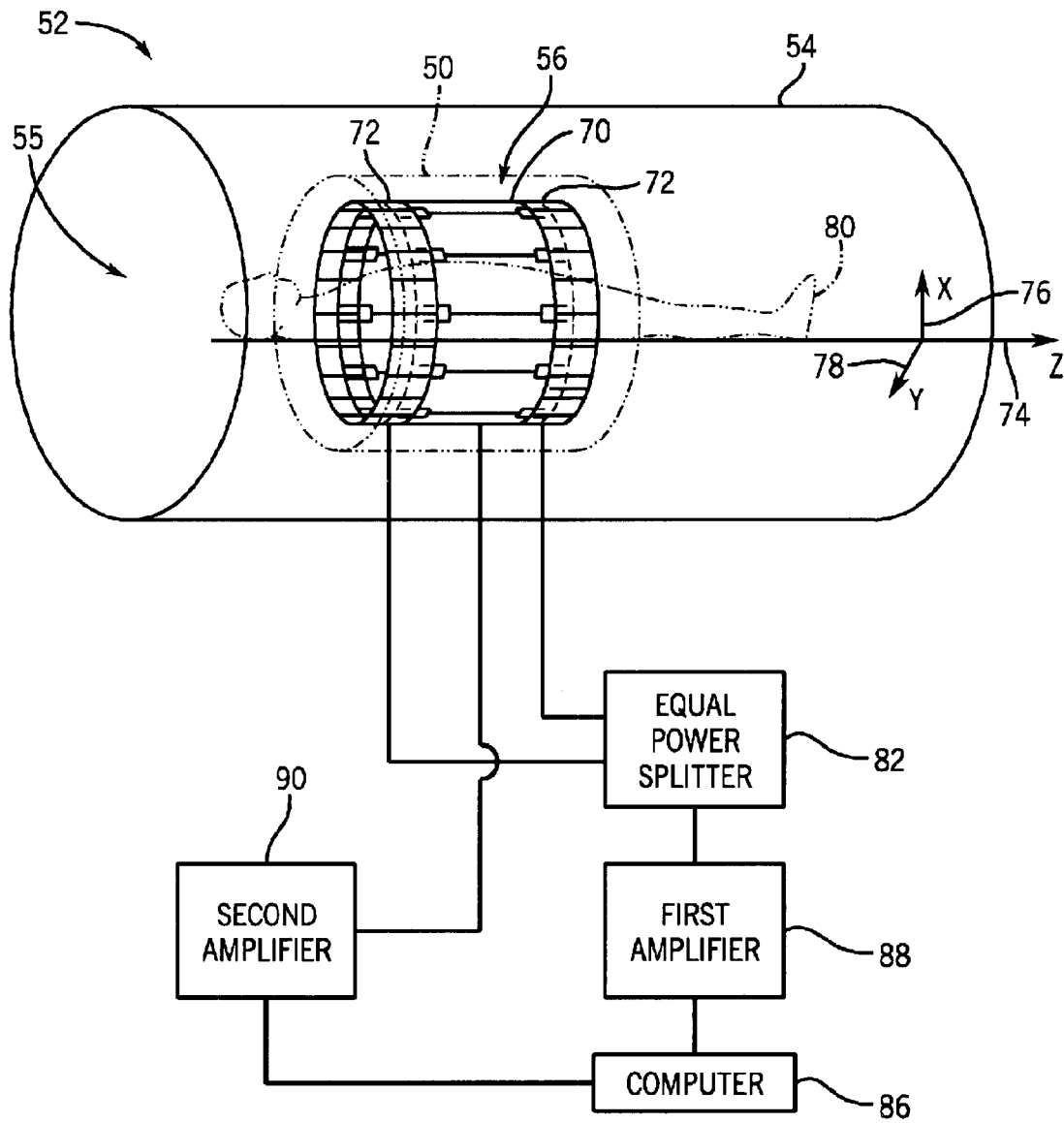
FIG. 3 is a schematic of another embodiment of an RF coil assembly connected to a block diagram of a control system in accordance with the present invention.

FIG. 3 shows another embodiment to control the RF coil assembly 56 shown in FIG. 1. The magnet assembly 52 and coil configuration 70, 72 is similar to that shown in FIG. 2. The set of end coils 72 are again connected to the equal power splitter 82 providing equal power to the end coils 72. The equal power splitter is also connected to a first amplifier 88 that is coupled to the computer 86. The computer 86 provides signals to the end coils 72 to generate a magnetic field in the internal space 55 of the end coils 72 of a particular amplitude. The computer 86 also provides signals to a second amplifier connected to the center coil 70. The signals from the second amplifier are amplified in such a manner that the current amplitude in the center coil 70, upon activation of the center coil 70 and end coils 72 simultaneously, matches the current amplitude in the end coils 72 such that the summation of currents produce an equivalent magnetic field amplitude similar to that produced in a single length birdcage coil having a total length equal to the combination of the center and end coils. Generally, since the end coils 72 are smaller than the center coil 70, less power is required to generate an equivalent current amplitude in the end coils 72 than that of the center coil 70.

The center coil 70 can be activated by computer 86 either alone or in unison with end coils 72 to transmit and/or receive RF signals. The transmitted signals are designed to obtain spatial spin data which is then processed by the computer 86 to reconstruct a subject 80. The computer 86 can be programmed to acquire a set of data for image reconstruction that is limited to an imaging volume defined by the FOV input. Thus, during reception of signals, the transverse magnetization of precessed nuclei are recorded and acquired by the selected receive coil, such as coils 70, 72 or a separate surface coil, as they precess in an X-Y plane defined by the X-Y axes 76, 78. In this manner, different imaging techniques can be used for image reconstruction.

In one embodiment, the center coil 70 and/or pair of end coils 72 can be birdcage resonators. Birdcage resonators are particularly beneficial in whole-body MR imaging. Such a resonator is constructed as a ladder circuit that closes upon itself. The current flow around the resonator is distributed sinusoidally. Further, the birdcage is designed such that a phase shift is discreetly distributed around the circumference of the resonator from 0 to $2\pi$ (or $2\pi k$ where k is an integer). Preferably, the center birdcage 70 has simultaneous electrical sinusoidal and cosinusoidal waveform inputs upon energization of the coil 70. In addition to birdcage resonators, other coil arrays, for example saddle and helical coils, are contemplated for use with the present invention.

In operation, a subject or patient 80 is placed inside the coil assembly 56 by the patient positioning system 48 such that the region desired to be scanned is within a designated FOV centered at the origin of the coordinate system axes 74–78. The RF coil assembly 56 is configured to encode and excite spins within the adjustable FOV having at least two general FOV size designations. An FOV size designation is based on an FOV size input is determined by control 32 switching power to activate either the center coil 70 only or center coil 70 in conjunction with the pair of end coils 72. Upon activation of the selected coils or resonators 70, 72, one or more RF signals or pulses are transmitted from the coils 70, 72 and then the coils can be switched to receive data, or a separate RF surface coil can be employed for data reception. The signals are then amplified 64 and processed by the control 32 to reconstruct an image of the subject 80 within the selected FOV, which can be displayed at 16. Generally, whole-body imaging used for large FOV images of a patient 80 in a sagittal or coronal plane, or oblique planes, is conducted by activating both the center coil 70 and the pair of end coils 72. The equal power splitter 82, connected to the pair of end coils 72, and the unequal power splitter 84 connected to the equal power splitter 82 and computer 86 causes signals from the computer 86 to create equal amplitude currents in the center coil 70 and the pair of end coils 72 matching a field equivalent to the equal length birdcage coil. Smaller or less than large FOV's, such as certain axial imaging scans and small FOV sagittal, coronal, and oblique imaging scans, can be conducted by activating the central coil 70 only.

The activation of the center coil 70 only or in unison with the pair of end coils 72 provides a method for switching the FOV between a shorter or longer FOV. Decreasing the center coil 70 size relative to a standard whole-body coil results in less wrap around artifacts during image reconstruction and less irradiation of patient volume. Switching between the FOV's is controlled by system control 32 which passes commands for the desired coil activation via scan room interface 46 and/or the transmit/receive switch 62.

Figure 4:
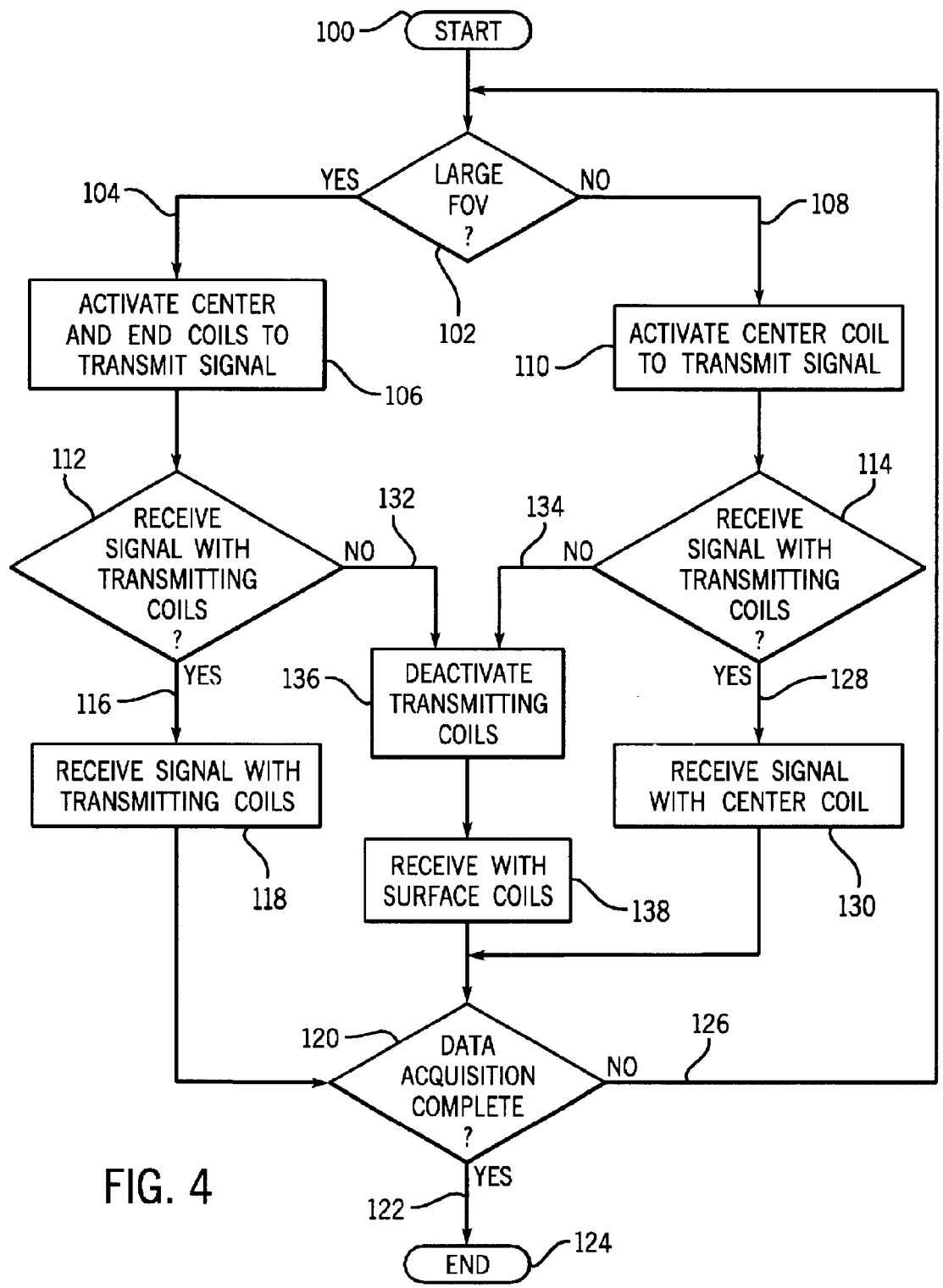
FIG. 4 is a flow chart showing a process to control the RF coil assembly of FIG. 2 and implemented in the system of FIG. 1.

Referring to FIG. 4, a technique of controlling an MRI device having a central RF coil and a pair of end RF coils is initiated at 100, and then a determination of the desired FOV size is made 102. If the size requested is large 104 (i.e., to cover the equivalent of a standard whole-body coil), the central RF coil and all end RF coils are activated 106 causing the transmission of a signal which passes through the patient and is received by the receiving coils, whether they are the same coils or a separate receiving coil. If the FOV size requested is not large 102,108 then only the center coil is activated to transmit 110.

Both FOV designations 104,108 independently decide whether to utilize their respective transmission coils 106, 110 as receiving coils 112, 114. Use of the transmitting coils as receiving coils for the large FOV 112, 116 results in signal reception at 118. The system then determines if data acquisition is complete 120, and if so 122, the process ends 124. If data acquisition is not complete 120, 126 then the technique loops back to step 102 and signal transmission occurs again. Likewise, if the transmitting coils are chosen to transmit and receive for an FOV designation that is something less than large 114, 128, then the center coil only can receive 130. Again the system determines if data acquisition is complete 120, and the technique either ends 124 or returns to step 102 causing a new transmission.

If the transmission coils are not selected as the receiving coils 132, 134, then the transmitting coils are deactivated 136. For the large FOV designation 104, both the central coil and the end coils are inactive. For the less than large FOV designation 108, only the center coil is deactivated since any end coils are already inactive. The transmitted signal is received with surface coils at 138 and then a determination is made on whether data acquisition is complete 120 similar to the previous determinations that used the transmitting coils as receiving coils.

In instances where a FOV has a longitudinal length greater than the length of the central RF coil, the method can be predetermined so as to automatically transmit and receive signals using both the central RF coil and the pair of end coils.

Accordingly, an RF coil and control configuration includes an RF coil assembly having a center coil and a pair of generally shorter end coils, wherein each end coil has at least one RF coil. The RF coil assembly is configured to encode and excite spins over an adjustable FOV, such as a large FOV designation for imaging in the coronal, sagittal, and/or oblique planes of a patient, and some large FOV axial planes, or a small FOV designation for partial body or certain axial imaging. A control connected to the RF coil assembly switches the RF coil assembly between at least two general FOV sizes by switching power to activate one of a center coil only or the center coil and the pair of end coils in unison.

In accordance with another aspect of the invention an MRI apparatus to acquire images is disclosed comprising a magnetic resonance imaging system having a plurality of gradient coils positioned about a bore of a magnet to impress a polarizing $B_0$ magnetic field through a patient under examination causing an alignment of the patient's nuclei spins. An RF transceiver system and an RF switch controlled by a pulse module transmit RF signals to an RF resonator assembly having a center resonator enclosed by a set of end resonators to acquire magnetic resonance images of the patient. A computer is also included and programmed to receive a FOV input and based on that input, cause transmission of a signal from either the center resonator only or the center resonator and the set of end resonators simultaneously.

A method of controlling an MRI device having an RF coil assembly comprised of a central RF coil and at least one pair of end RF coils is also disclosed. The technique includes the steps of creating a predetermined parameter based on a length of a central RF coil and then comparing a desired FOV to the predetermined parameter. If the desired FOV is not greater than the predetermined parameter, then the central RF coil is selected for energization so as to perform an image scan of the desired FOV, such as a partial body imaging scan. If the desired FOV is greater than the selected parameter, then the central RF coil and at least one pair of end RF coils are selected for energization thereby performing an imaging scan of the desired FOV.

The present invention has been described in terms of the preferred embodiment, and it is recognized that equivalents, alternatives, and modifications, aside from those expressly stated, are possible and within the scope of the appending claims.

What is claimed is:

1. An RF coil and control configuration comprising:
   an RF coil assembly having a center coil and a pair of end coils, each end coil comprised of at least one RF coil, the RF coil assembly configured to encode and excite spins over an adjustable FOV; and
   a control connected to the RF coil assembly to switch the RF coil assembly between at least two general FOV size designations based on an FOV size input, the at least two general FOV size designations determined by the control switching power to activate one of:
   the center coil only; and
   the center coil and the pair of end coils in unison.

2. The RF coil and control configuration of claim 1 wherein the at least two general FOV size designations include a small FOV size in which the center coil only is activated and a large FOV size in which the center coil and the pair of end coils are activated.

3. The RF coil and control configuration of claim 1 wherein the RF coil assembly transmits and receives signals to acquire a set of data for the FOV size input.

4. The RF coil and control configuration of claim 1 wherein acquisition of data in an axial imaging plane can be accomplished with the center coil only.

5. The RF coil and control configuration of claim 1 further comprising:
   a computer configured to generate control signals;
   an unequal power splitter connected to the center coil and the computer;
   an equal power splitter connected to the pair of end coils and the unequal power splitter; and
   wherein the control switching power to the center coil and the pair of end coils in unison generates a magnetic field amplitude in the RF coil assembly substantially equivalent to that of a single birdcage.

6. The RF coil and control configuration of claim 5 wherein the center coil has a longitudinal length less than a standard whole-body RF coil.

7. The RF coil and control configuration of claim 1 further comprising:
   a computer configured to generate control signals;
   a first amplifier connected to the center coil and the computer;
   a second amplifier connected to the computer;
   an equal power splitter connected to the pair of end coils and the second amplifier; and
   wherein the control switching power to the center coil and the pair of end coils in unison generates a uniform amplitude magnetic field in the RF coil assembly.

8. The RF coil and control configuration of claim 1 wherein the center coil and the pair of end coils partially overlap so as to minimize a mutual inductance between the center coil and the pair of end coils.

9. The RF coil and control configuration of claim 1 wherein one of the center coil only and the pair of end coils only comprises a birdcage resonator.

10. The RF coil and control configuration of claim 1 wherein the center coil and the pair of end coils are each a birdcage resonator.

11. The RF coil and control configuration of claim 1 wherein each end coil of the pair of end coils at least partially overlaps an end of the center coil.

12. An MRI apparatus to acquire images comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF resonator assembly having a center resonator enclosed by a set of end resonators to acquire MR images; and
a computer programmed to:
receive an FOV input; and
based on the FOV input, cause transmission of a signal from one of:
the center resonator only; and
the center resonator and the set of end resonators simultaneously.

13. The MRI apparatus of claim 12 further comprising:
an unequal power splitter connected to the center resonator and the computer such that the computer causes an output from only the center resonator when the received FOV input is selected to cause transmission from the center resonance only; and
an equal power splitter connected to the set of end resonators and the unequal power splitter, such that the computer causes equal outputs from the center resonator and the set of end resonators when the received FOV input is selected to cause transmission from the center resonator and the set of end resonators simultaneously.

14. The MRI apparatus of claim 12 further comprising:
a first amplifier connected to the center resonator and the computer;
a second amplifier connected to the computer;
an equal power splitter connected to the set of end resonators and the second amplifier; and
wherein the control switching power to the center resonator and the set of end resonators simultaneously generates the equal output from the center resonator and the set of end resonators.

15. The MRI apparatus of claim 12 wherein the center resonator and the set of end resonators are each birdcage resonators.

16. The MRI apparatus of claim 12 wherein the center resonator comprises a birdcage resonator having simultaneous electrical sinusoidal and cosinusoidal waveform inputs upon energization of the center resonator.

17. The MRI apparatus of claim 12 wherein the computer is further programmed to acquire a set of data for image reconstruction limited to an imaging volume defined by the FOV input.

18. The MRI apparatus of claim 12 wherein the center resonator and the set of end resonators partially overlap so as to minimize mutual inductance therebetween.

19. The MRI apparatus of claim 12 wherein an FOV input designating a large FOV in a non-axial image acquisition causes activation of the center resonator and the set of end resonators.

20. The MRI apparatus of claim 12 wherein an FOV input designating a small FOV cause activation of the center resonator only.

21. A method of controlling an MRI device having an RF coil assembly comprised of a central RF coil and at least one pair of end RF coils comprising:
creating a predetermined parameter based on a length of the central RF coil; and
comparing a desired FOV to the predetermined parameter; and
if the desired FOV is not greater than the predetermined parameter, selecting the central RF coil for energization so as to perform an image scan of the desired FOV; and
if the desired FOV is greater than the selected parameter, selecting the central RF coil and the at least one pair of end RF coils for energization so as to perform an imaging scan of the desired FOV.

22. The method of claim 21 wherein the length of the central RF coil is less than a standard MRI full-body RF coil.

23. The method of claim 21 wherein the central RF coil and the at least one pair of end RF coils have approximately a 1 centimeter overlap so as to minimize mutual inductance therebetween.

24. The method of claim 21 wherein the central RF coil and the at least one pair of end RF coils transmit and receive signals if the desired FOV has a longitudinal length greater than the length of the central RF coil.

25. The method of claim 21 further comprising the steps of:
creating a linear uniform magnetic field in the desired FOV;
polarizing and exciting a set of spins in the desired FOV; and
encoding the set of spins.

26. The method of claim 21 wherein the central RF coil is a birdcage coil.

27. The method of claim 21 wherein the desired FOV is one of a whole-body FOV designation and a FOV designation less than the predetermined parameter.

* * * * *